US008295022B2

(12) United States Patent  
Tang et al.

(10) Patent No.: US 8,295,022 B2  
(45) Date of Patent: Oct. 23, 2012

(54) OVERSTRESS PROTECTION APPARATUS AND METHOD

(75) Inventors: Chien-Fu Tang, Hsinchu (TW); Isaac Y Chen, Jubei (TW); Chi-Hua Lin, Hsinchu (TW)

(73) Assignee: Richtek Technology Corp., Hsinchu (TW)

( * ) Notice: Subject to any disclaimer, the term of this patent is extended or adjusted under 35 U.S.C. 154(b) by 198 days.

(21) Appl. No.: 12/815,677

(22) Filed: Jun. 15, 2010

(65) Prior Publication Data

US 2010/0321849 A1    Dec. 23, 2010

(30) Foreign Application Priority Data

Jun. 19, 2009    (TW) ................................. 98120627 A

(51) Int. Cl.  
*H02H 3/08*    (2006.01)

(52) U.S. Cl. ...................................... 361/93.9; 361/93.7
(58) Field of Classification Search ........ 361/93.7–93.9, 361/103, 111  
See application file for complete search history.

(56) References Cited

U.S. PATENT DOCUMENTS

| 5,724,218 | A  | * | 3/1998  | Tihanyi ........................... 361/79 |
| 6,320,275 | B1 | * | 11/2001 | Okamoto et al. ............ 307/10.1 |
| 6,538,480 | B2 | * | 3/2003  | Takada et al. ................. 327/108 |
| 6,975,493 | B2 | * | 12/2005 | Strayer et al. .................... 361/56 |

* cited by examiner

*Primary Examiner* — Danny Nguyen  
(74) *Attorney, Agent, or Firm* — Muncy, Geissler, Olds & Lowe, PLLC

(57) ABSTRACT

An overstress protection apparatus includes a switch detector. The switch is arranged in a grounding path of a load system. The detector detects the current, voltage or temperature of the load system to determine a signal for controlling the switch, to thereby protect the load system working in normal conditions.

8 Claims, 5 Drawing Sheets

US 8,295,022 B2

OVERSTRESS PROTECTION APPARATUS AND METHOD

FIELD OF THE INVENTION

The present invention is related generally to an overstress protection apparatus and method.

BACKGROUND OF THE INVENTION

The various chips on a circuit board operate with different voltages and are therefore designed according to their respective voltage tolerance levels. In normal operating conditions, circuits with different operating voltages are separated from each other. Nonetheless, in practice, it is possible for a short circuit being established between the pins of circuits with different operating voltages, for example, because of accumulation of dust, or intrusion of an electrically conductive substance such as water or metal. Given an ordinary design framework without any protection apparatus, a short circuit between the pins of circuits with different operating voltages is likely to subject a chip to overcurrent and hence excessive power consumption. As a result, the overloaded chip heats up quickly and may burn out or even catch fire, thereby posing a safety issue.

U.S. Pat. No. 6,829,129 connects each of alternating current (AC) power supplies with a fuse in series thereto, and each two of the power supplies with a metal oxide varistor therebetween. The metal oxide varistor or the fuse will burn out under abnormal circuit conditions to break and thereby protect the circuit. In practice, however, the metal oxide varistor and the fuse are not very reliable, sometimes burnout resistant, and therefore may not be effective in protecting a circuit.

U.S. Pat. No. 7,274,543 connects an overvoltage protection circuit to an I/O pin of a chip to identify whether or not the voltage at the I/O pin is within a normal operating range and accordingly, to control a high-breakdown-voltage MOS transistor to disconnect the chip from the power supply of unduly high voltage. However, as a short circuit may occur at each of the I/O pins of a chip, it is necessary to provide each of the I/O pins with an overvoltage protection circuit, and the overvoltage protection circuits will take up much space.

U.S. Pat. No. 7,253,505 connects a layer of variable-resistance material between a ground terminal and a ground layer of a chip. When a surge pulse occurs, the energy of the surge pulse will flow through the variable-resistance material. Due to the nature of the variable-resistance material, the energy of the surge pulse will be released evenly to the ground lines, and the chip is thus protected from damage. This solution works only with a specific manufacturing process and therefore does not apply to all types of chips. More badly, with the layer of variable-resistance material disposed on the ground layer, an increase in current is always accompanied a reduction in voltage, and hence it is not applicable to chips which operate with high current.

Therefore, it is desired a simple-structure, widely applicable, and small-size overstress protection apparatus.

SUMMARY OF THE INVENTION

An object of the present invention is to provide an overstress protection apparatus and method.

Another object of the present invention is to provide a small-size overstress protection apparatus.

According to the present invention, an overstress protection apparatus includes a switch and a detector. The switch is in a grounding path of a load system, and the detector detects the current, voltage or temperature of the load system to determine a signal for controlling the switch.

According to the present invention, an overstress protection method includes detecting the current, voltage or temperature of a load system to determine a signal, and switching a switch between the load system and a ground terminal by the signal.

Preferably, a resistor is further included to establish a current path between the load system and the ground terminal during the switch is off.

BRIEF DESCRIPTION OF THE DRAWINGS

These and other objects, features and advantages of the present invention will become apparent to those skilled in the art upon consideration of the following description of the preferred embodiments of the present invention taken in conjunction with the accompanying drawings, in which.

DETAILED DESCRIPTION OF THE INVENTION

Figure 1:
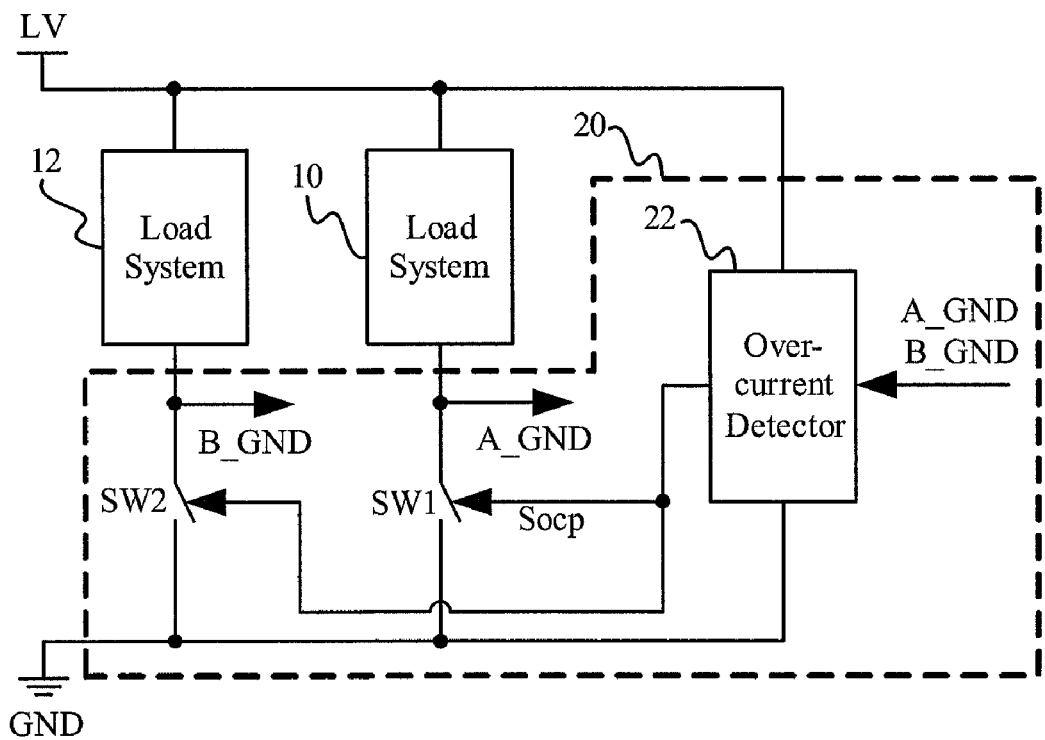
FIG. 1 is a circuit diagram of a first embodiment according to the present invention.

FIG. 1 is a circuit diagram of a first embodiment according to the present invention, in which load systems 10 and 12 are circuit systems operating with an input voltage LV, and an overstress protection apparatus 20 is operative to protect the load systems 10 and 12. The overstress protection apparatus 20 includes switches SW1 and SW2 and an overcurrent detector 22. The switches SW1 and SW2 are connected between a ground terminal GND and load terminals A_GND and B_GND, respectively. The overcurrent detector 22 detects the voltage at the load terminals A_GND and B_GND to detect the current flowing through the switches SW1 and SW2, and thereby determines an overcurrent signal Socp for controlling the switches SW1 and SW2. In normal operation, the voltage at the power supply terminal LV is a low voltage and detected by the overcurrent detector 22, the currents flowing through the load terminals A_GND and B_GND will be within preset ranges. Therefore, the overcurrent signal Socp will turn on the switches SW1 and SW2 and thus allows the currents flowing through the switches SW1 and SW2. However, if a short circuit happens between the power supply terminal LV and any other power supply terminal receiving a higher voltage so that the overcurrent detector 22 detects the currents flowing through the load terminals A_GND and B_GND over its preset range, the overcurrent signal Socp will be changed to turn off the switches SW1 and SW2. In consequence, the grounding paths of the load systems 10 and 12 are cut off to stop the load systems 10 and 12 from operation.

Figure 2:
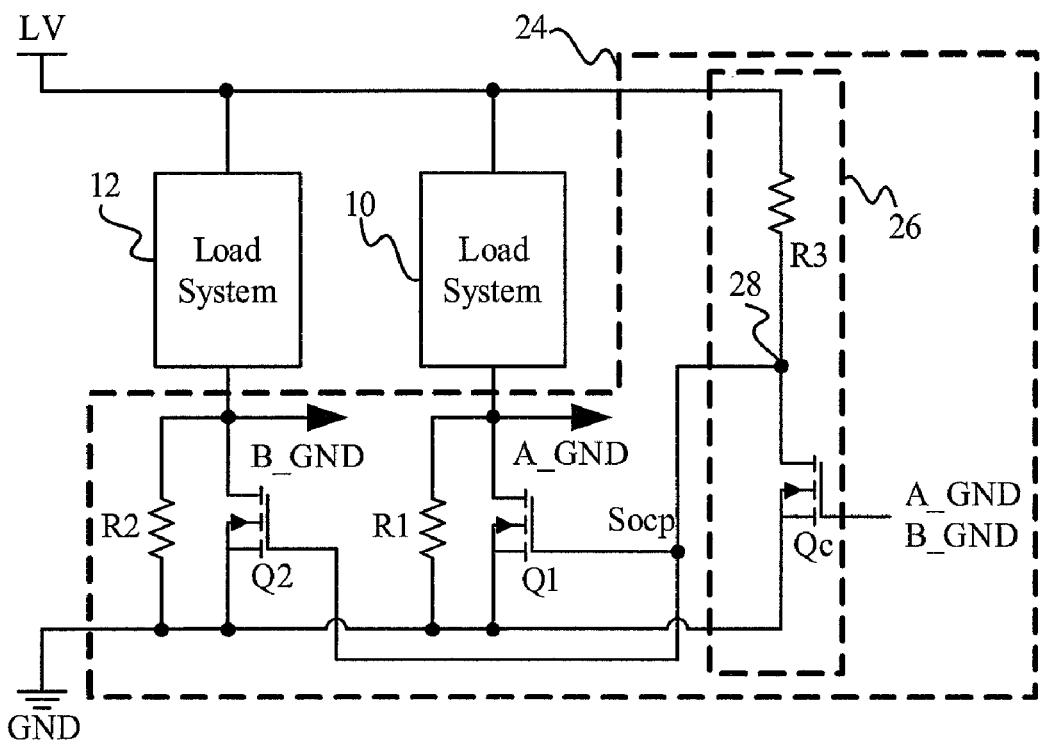
FIG. 2 is a circuit diagram of a second embodiment according to the present invention.

FIG. 2 is a circuit diagram of a second embodiment according to the present invention, in which an overstress protection apparatus 24 is operative to protect load systems 10 and 12. In the overstress protection apparatus 24, MOSes Q1 and Q2 are connected between the ground terminal GND and the load terminals A_GND and B_GND, respectively, and are connected with resistors R1 and R2 in parallel, respectively, and an overcurrent detector 26 includes an output terminal 28 for providing an overcurrent signal Socp to control the MOSes Q1 and Q2, a resistor R3 connected between the power supply terminal LV and the output terminal 28, and a MOS Qc connected between the output terminal 28 and the ground terminal GND to be controlled by the voltages at the load terminals A_GND and B_GND. In normal operation, the voltage at the power supply terminal LV is a low voltage, and thus the currents flowing through the load terminals A_GND and B_GND are both low. As a result, the voltages of the MOSes Q1 and Q2 are lower, and the voltages at the load terminals A_GND and B_GND are insufficient to turn on the MOS Qc. Hence, the overcurrent signal Socp is high and turns on the MOSes Q1 and Q2. However, if a short circuit happens between the power supply terminal LV and any other power supply terminal receiving a higher voltage, the currents flowing through the load terminals A_GND and B_GND will increase, and so will the voltages of the MOSes Q1 and Q2. As a result, the voltages at the load terminals A_GND and B_GND rise, thereby turning on the MOS Qc, while the overcurrent signal Socp becomes low, thereby turning off the MOSes Q1 and Q2. The currents of the load systems 10 and 12 will flow to the ground terminal GND through the resistors R1 and R2, respectively, and thereby establish a great voltage drop to pull high the electrical potential of the load systems 10 and 12, as well as to increase the resistance between the power supply terminal LV and the ground terminal GND to result in a reduced total current. Ultimately, the voltage across the load systems 10 and 12 is maintained within a normal range to protect the load systems 10 and 12.

Figure 3:
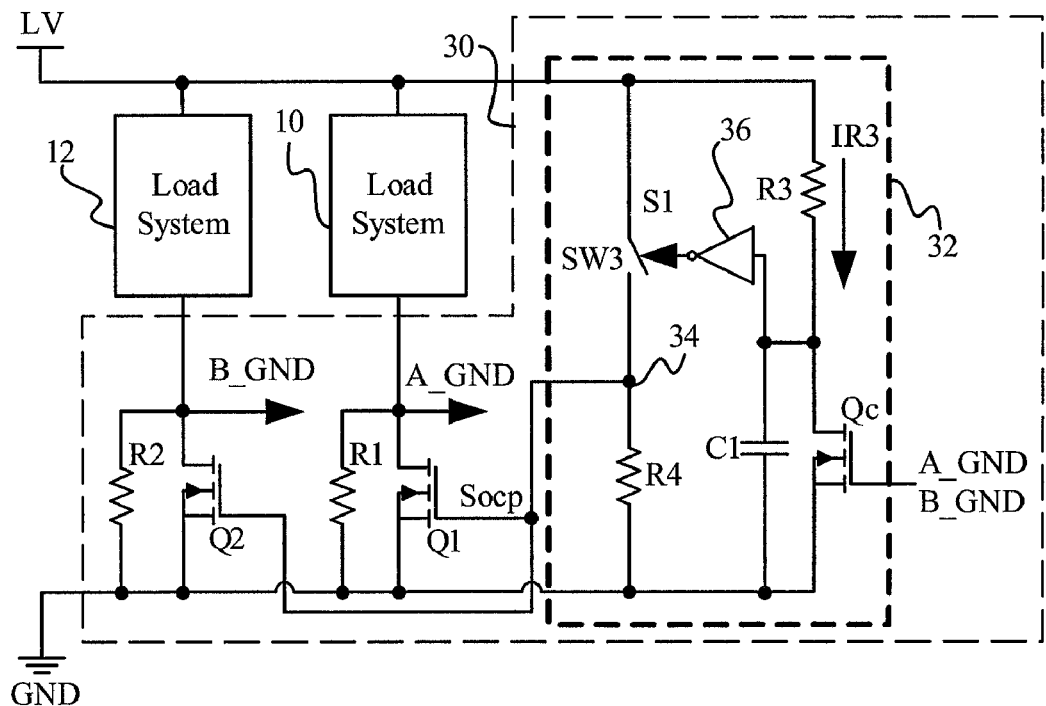
FIG. 3 is a circuit diagram of a third embodiment according to the present invention.

FIG. 3 is a circuit diagram of a third embodiment according to the present invention, in which an overstress protection apparatus 30 is operative to protect load systems 10 and 12. In the overstress protection apparatus 30, MOSes Q1, Q2 and resistors R1, R2 are all the same as that of the embodiment shown in FIG. 2. However, an overcurrent detector 32 includes a resistor R3 and a capacitor C1 serially connected between a power supply terminal LV and a ground terminal GND, a MOS Qc connected with the capacitor C1 in parallel, a switch SW3 and a resistor R4 connected between the power supply terminal LV and the ground terminal GND, an inverter 36 connected between the capacitor C1 and the switch SW3, and an output terminal 34 for providing an overcurrent signal Socp to control the MOSes Q1 and Q2. In normal operation, the voltage at the power supply terminal LV is a low voltage, and the currents flowing through the load terminals A_GND and B_GND are both low. As a result, the voltages of the MOSes Q1 and Q2 are lower, and the voltages at the load terminals A_GND and B_GND are insufficient to turn on the MOS Qc. Hence, the capacitor C1 is charged by a current IR3 flowing through the resistor R3 such that a low-level signal Si is generated to turn on the switch SW3, and the overcurrent signal Socp is high and thus turns on the MOSes Q1 and Q2. If a short circuit happens between the power supply terminal LV and any other power supply terminal receiving a higher voltage, the currents flowing through the load terminals A_GND and B_GND will increase, and so will the voltages of the MOSes Q1 and Q2. As a result, the voltages at the load terminals A_GND and B_GND turn on the MOS Qc, and the capacitor C1 is discharged such that a high-level signal Si is generated to turn off the switch SW3. Consequently, the overcurrent signal Socp becomes low and thus turns off the MOSes Q1 and Q2. The currents of the load systems 10 and 12 will flow to the ground terminal GND through the resistors R1 and R2, respectively, thereby pulling high the voltages at the load terminals A_GND and B_GND to protect the load systems 10 and 12.

Figure 4:
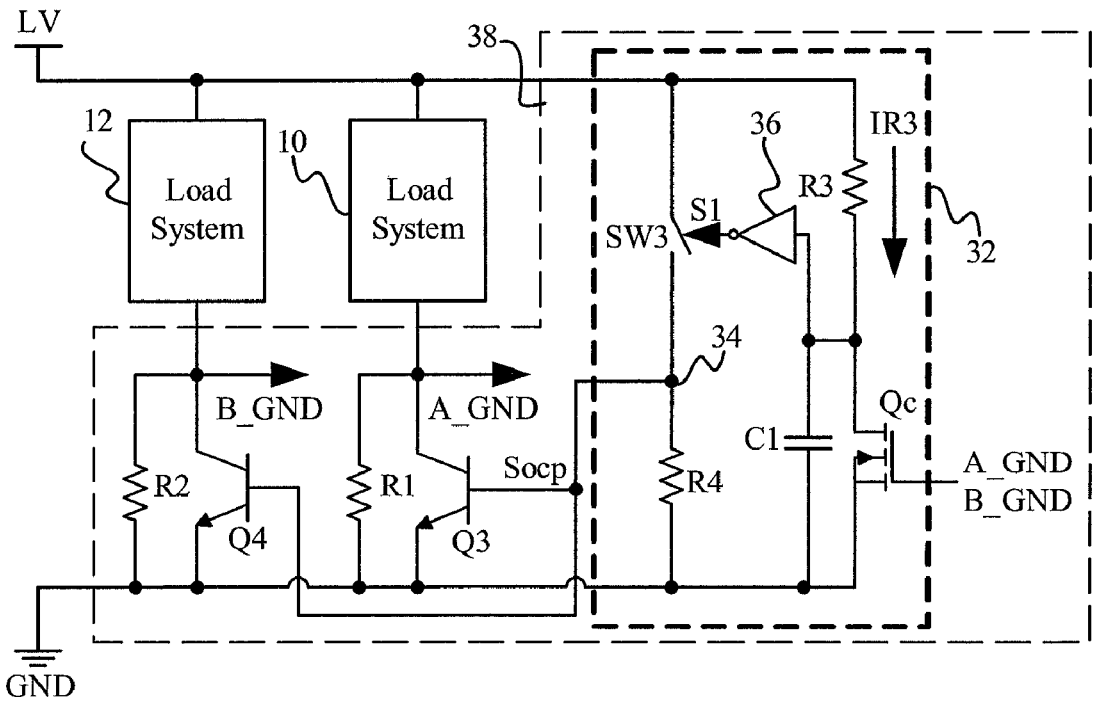
FIG. 4 is a circuit diagram of a fourth embodiment according to the present invention.

Replacing the MOSes Q1 and Q2 shown in FIG. 3 by bipolar junction transistors (BJTs) Q3 and Q4 turns the third embodiment into a fourth embodiment as shown in FIG. 4, in which an overstress protection apparatus 38 operates in the same way as the overstress protection apparatus 30 shown in FIG. 3.

Figure 5:
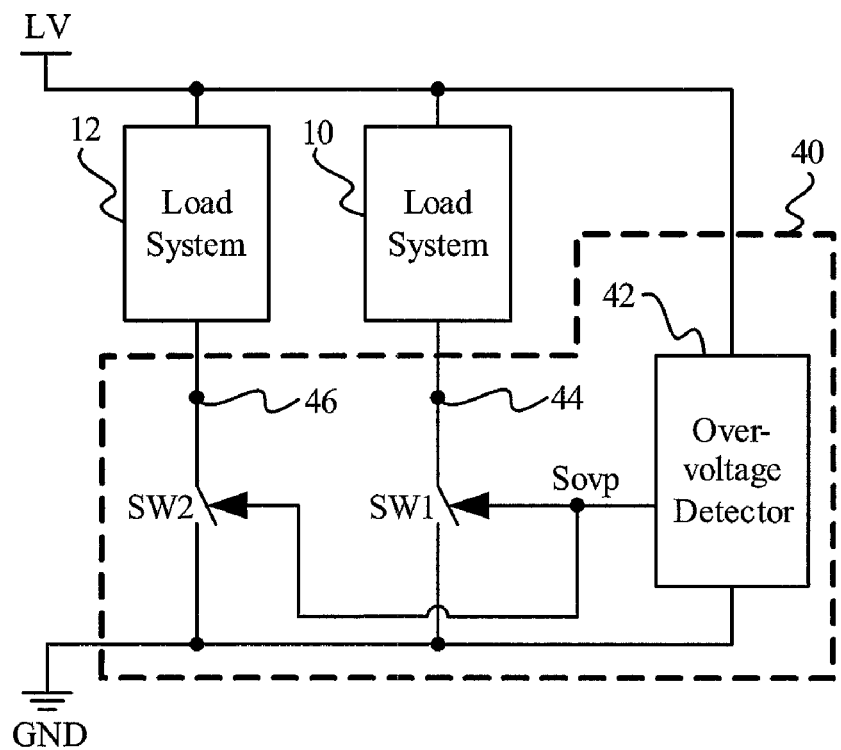
FIG. 5 is a circuit diagram of a fifth embodiment according to the present invention.

FIG. 5 is a circuit diagram of a fifth embodiment according to the present invention, in which an overstress protection apparatus 40 is operative to protect load systems 10 and 12. In the overstress protection apparatus 40, switches SW1 and SW2 are connected between load terminals 44 and 46 and a ground terminal GND, respectively, and an overvoltage detector 42 is connected to a power supply terminal LV to detect the voltage thereof to determine an overvoltage signal Sovp for controlling the switches SW1 and SW2. In normal operation, the voltage at the power supply terminal LV is a low voltage and is identified within a preset range by the overvoltage detector 42, and the overvoltage signal Sovp turns on the switches SW1 and SW2. However, if a short circuit happens between the power supply terminal LV and any other power supply terminal receiving a higher voltage such that the voltage at the power supply terminal LV is detected over the preset range by the overvoltage detector 42, the overvoltage signal Sovp will turn off the switches SW1 and SW2. In consequence, the grounding paths of the load systems 10 and 12 are cut off to stop the load systems 10 and 12 from operation.

Figure 6:
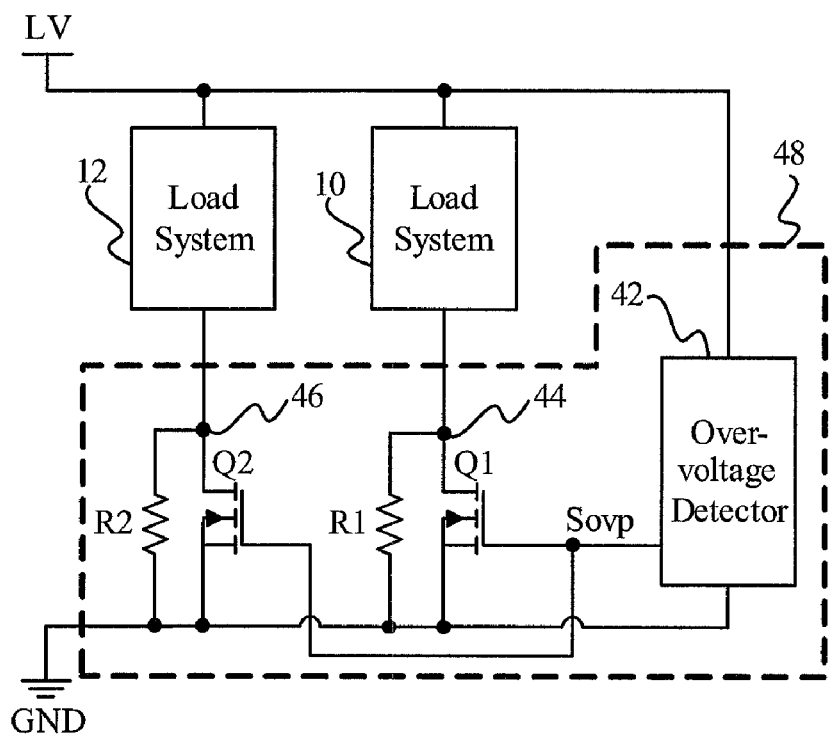
FIG. 6 is a circuit diagram of a sixth embodiment according to the present invention.

FIG. 6 is a circuit diagram of a sixth embodiment according to the present invention, in which an overstress protection apparatus 48 is operative to protect load systems 10 and 12. In the overstress protection apparatus 48, MOSes Q1 and Q2 are connected between the load terminals 44, 46 and a ground terminal GND, respectively, and connected with resistors R1, R2 in parallel, respectively, and an overvoltage detector 42 is connected to the power supply terminal LV to provide an overvoltage signal Sovp for controlling the MOSes Q1 and Q2. If the overvoltage detector 42 detects the voltage at the power supply terminal LV within a preset range, the overvoltage signal Sovp will turn on the MOSes Q1 and Q2. If a short circuit happens between the power supply terminal LV and any other power supply terminal receiving a higher voltage such that the overvoltage detector 42 detects the voltage at the power supply terminal LV over the preset range, the overvoltage signal Sovp will turn off the MOSes Q1 and Q2. The currents of the load systems 10 and 12 will flow to the resistors R1 and R2, respectively, to pull high the voltages at the load terminals 44 and 46 to protect the load systems 10 and 12.

Figure 7:
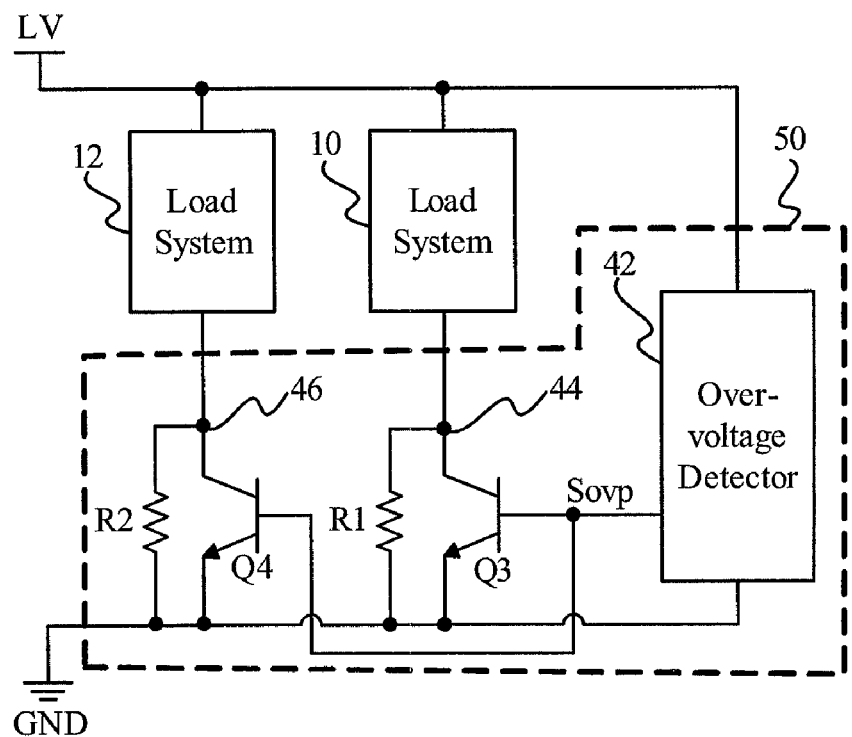
FIG. 7 is a circuit diagram of a seventh embodiment according to the present invention.

Replacing the MOSes Q1 and Q2 shown in FIG. 6 by BJTs Q3 and Q4 turns the sixth embodiment into a seventh embodiment as shown in FIG. 7, in which an overstress protection apparatus 50 operates in the same way as the overstress protection apparatus 48 shown in FIG. 6.

Figure 8:
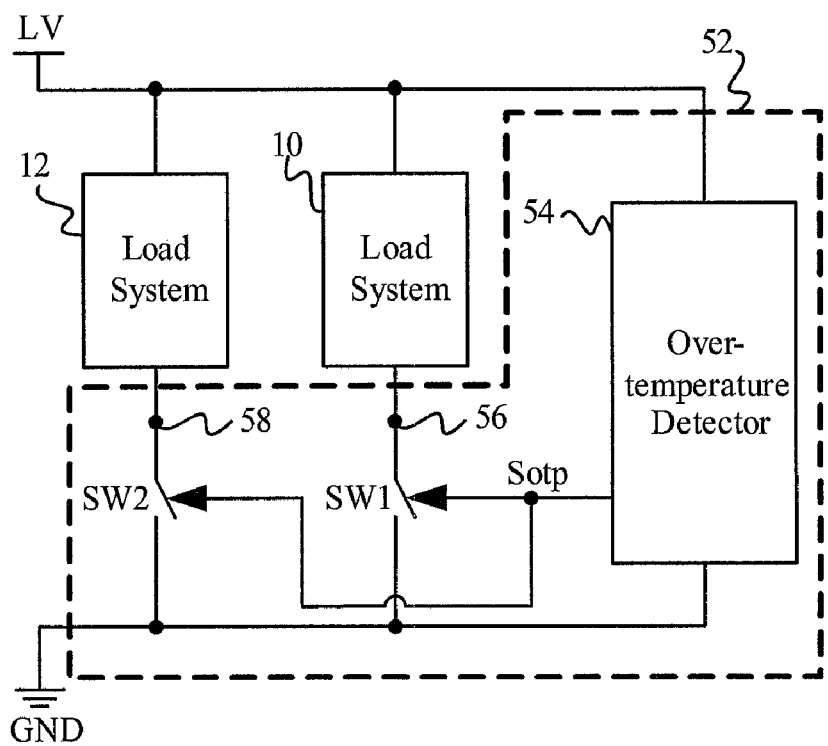
FIG. 8 is a circuit diagram of an eighth embodiment according to the present invention.

FIG. 8 is a circuit diagram of an eighth embodiment according to the present invention, in which an overstress protection apparatus 52 is operative to protect load systems 10 and 12. In the overstress protection apparatus 52, switches SW1, SW2 are connected between load terminals 56, 58 and the ground terminal GND, respectively, an overtemperature detector 54 detects the temperatures of the load systems 10 and 12 to determine an overtemperature signal Sotp for controlling the switches SW1 and SW2. If a short circuit happens between a power supply terminal LV and any other power supply terminal receiving a higher voltage, a large current will be generated to cause the temperatures of the load systems 10 and 12 to rise. Once the overtemperature detector 54 detects an abnormal temperature of the load systems 10 and 12, the overtemperature signal Sotp will turn off the switches SW1 and SW2. As a result, the grounding paths of the load systems 10 and 12 are cut off to stop the load systems 10, 12 from operation.

Figure 9:
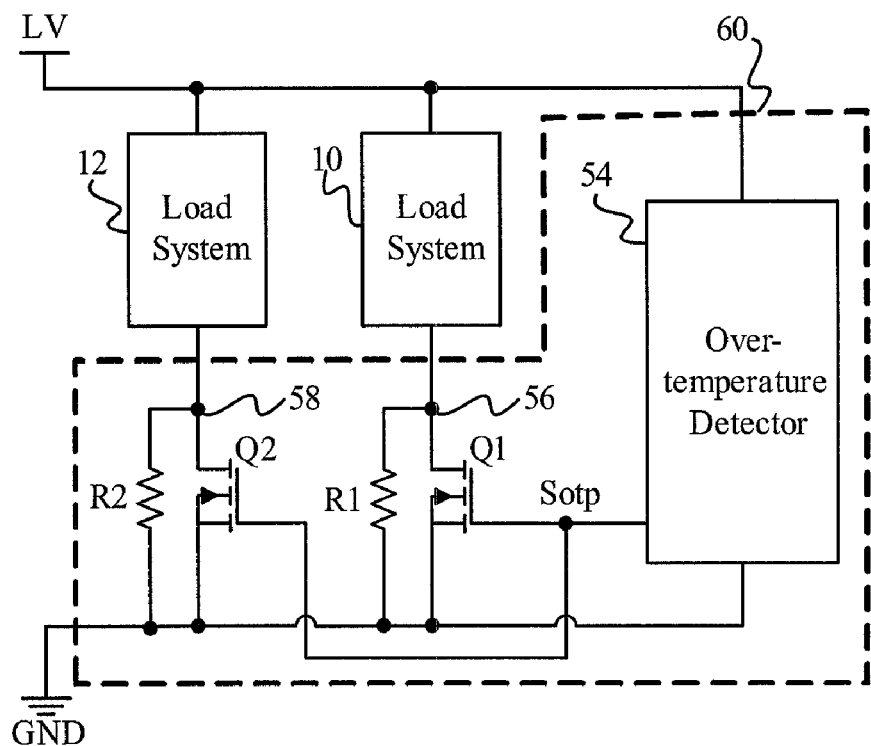
FIG. 9 is a circuit diagram of a ninth embodiment according to the present invention.

FIG. 9 is a circuit diagram of a ninth embodiment according to the present invention, in which an overstress protection apparatus 60 is operative to protect load systems 10 and 12. In the overstress protection apparatus 60, MOSes Q1 and Q2 are connected between the ground terminal GND and load terminals 56, 58, respectively, and connected with resistors R1, R2 in parallel, respectively. The overtemperature detector 54 detects the temperature of the load systems 10 and 12 to determine an overtemperature signal Sotp applied to the gates of the MOSes Q1 and Q2. When the load systems 10 and 12 operate at normal temperature, the overtemperature signal Sotp turns on the MOSes Q1 and Q2. If a short circuit happens between the power supply terminal LV and any other power supply terminal receiving a higher voltage, the load systems 10 and 12 will be overheated due to overloaded. Once the temperature of the load systems 10 and 12 are detected over a preset range, the overtemperature signal Sotp will turn off the MOSes Q1 and Q2. The currents of the load systems 10 and 12 will flow to the ground terminal GND through the resistors R1 and R2, respectively, thereby pulling high the voltages at the load terminals 56 and 58 to protect the load systems 10 and 12.

Figure 10:
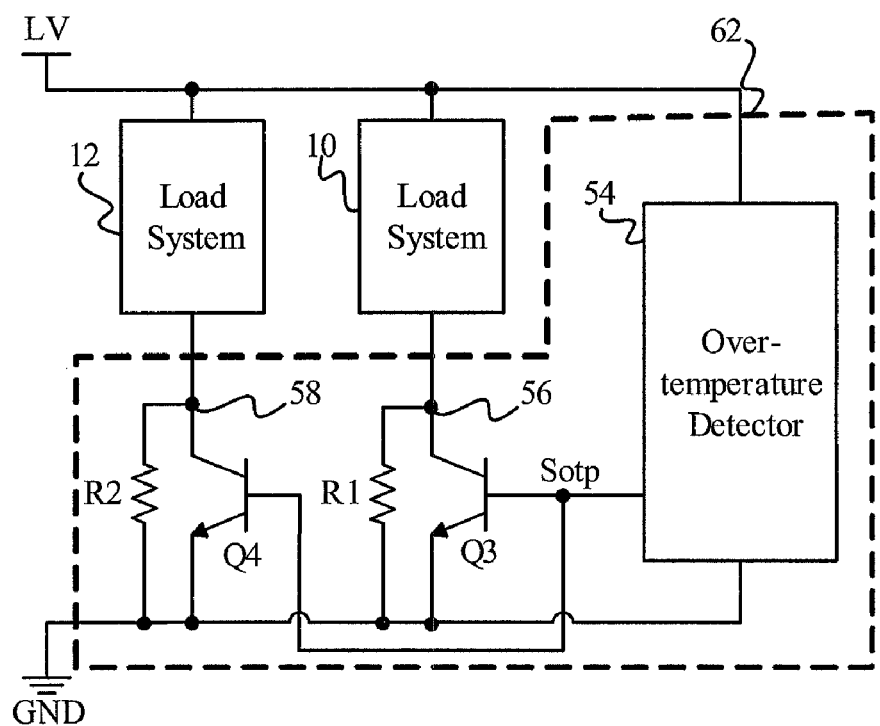
FIG. 10 is a circuit diagram of a tenth embodiment according to the present invention.

Replacing the MOSes Q1 and Q2 shown in FIG. 9 by BJTs Q3 and Q4 turns the ninth embodiment into a tenth embodiment as shown in FIG. 10, in which an overstress protection apparatus 62 operates in the same way as the overstress protection apparatus 60 shown in FIG. 9.

While the present invention has been described in conjunction with preferred embodiments thereof, it is evident that many alternatives, modifications and variations will be apparent to those skilled in the art. Accordingly, it is intended to embrace all such alternatives, modifications and variations that fall within the spirit and scope thereof as set forth in the appended claims.

What is claimed is:

1. An overstress protection apparatus, comprising:
a ground terminal;
a load terminal;
a first switch connected between the load terminal and the ground terminal; and
an overcurrent detector connected to the first switch, operative to detect a current flowing through the first switch to determine an overcurrent signal for controlling the first switch, wherein the overcurrent detector comprises:
an output terminal for providing the overcurrent signal;
a resistor connected between a power supply terminal and the output terminal; and
a second switch connected between the output terminal and the ground terminal, being controlled by a voltage at the load terminal to determine the overcurrent signal.

2. The overstress protection apparatus of claim 1, wherein the first switch comprises a MOS.

3. The overstress protection apparatus of claim 1, wherein the first switch comprises a BJT.

4. The overstress protection apparatus of claim 1, further comprising a second resistor connected with the first switch in parallel between the load terminal and the ground terminal.

5. An overstress protection apparatus, comprising:
a ground terminal;
a load terminal;
a first switch connected between the load terminal and the ground terminal; and
an overcurrent detector connected to the first switch, operative to detect a current flowing through the first switch to determine an overcurrent signal for controlling the first switch, wherein the overcurrent detector comprises:
a first resistor and a capacitor connected in series between a power supply terminal and the ground terminal;
a second resistor and a second switch connected in series between the power supply terminal and the ground terminal;
a third switch connected with the capacitor in parallel, being controlled by a voltage at the load terminal;
an inverter connected between the capacitor and the second-switch; and
an output terminal taped from a terminal of the second resistor, for providing the overcurrent signal.

6. The overstress protection apparatus of claim 5, wherein the first switch comprises a MOS.

7. The overstress protection apparatus of claim 5, wherein the first switch comprises a BJT.

8. The overstress protection apparatus of claim 5, further comprising a third resistor connected with the first switch in parallel between the load terminal and the ground terminal.

* * * * *